(12) United States Patent
Choi

(10) Patent No.: US 7,839,479 B2
(45) Date of Patent: Nov. 23, 2010

(54) THIN FILM TRANSISTOR ARRAY SUBSTRATE COMPRISING A FIRST INSULATING LAYER COMPLETELY COVERING THE DUMMY TESTING PAD, DISPLAY USING THE SAME, AND FABRICATION METHOD THEREOF

(75) Inventor: Woong Sik Choi, Kyunggi-do (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 414 days.

(21) Appl. No.: 11/159,111

(22) Filed: Jun. 23, 2005

(65) Prior Publication Data

US 2006/0001792 A1    Jan. 5, 2006

(30) Foreign Application Priority Data

Jun. 24, 2004    (KR) ...................... 10-2004-0047887

(51) Int. Cl.
*G02F 1/1345* (2006.01)
*G01R 31/00* (2006.01)

(52) U.S. Cl. ........................ 349/152; 349/149; 349/151; 349/138; 324/770

(58) Field of Classification Search .................. 349/43, 349/138, 122, 69, 152; 324/770
See application file for complete search history.

(56) References Cited

U.S. PATENT DOCUMENTS

| | | | |
|---|---|---|---|
| 4,951,098 A | 8/1990 | Albergo et al. | |
| 6,359,342 B1 | 3/2002 | Yuan et al. | |
| 6,380,591 B1* | 4/2002 | Kawano | 257/359 |
| 6,437,596 B1 | 8/2002 | Jenkins et al. | |
| 6,930,744 B1* | 8/2005 | Ukita | 349/152 |
| 6,940,301 B2* | 9/2005 | Chen | 324/770 |
| 7,417,867 B1* | 8/2008 | Matsuda et al. | 361/752 |
| 2002/0051114 A1* | 5/2002 | Kwak et al. | 349/192 |
| 2002/0089614 A1* | 7/2002 | Kim | 349/40 |
| 2002/0097367 A1* | 7/2002 | Hirabayashi | 349/149 |
| 2002/0131004 A1* | 9/2002 | Watanabe et al. | 349/139 |
| 2002/0196389 A1* | 12/2002 | Koyama | 349/69 |
| 2003/0197826 A1* | 10/2003 | Yun et al. | 349/149 |
| 2004/0000865 A1 | 1/2004 | Yamazaki | |

FOREIGN PATENT DOCUMENTS

| | | |
|---|---|---|
| JP | 62-183134 | 8/1987 |
| JP | 2001-176657 A1 | 6/2001 |
| JP | 2002-066113 | 3/2002 |
| JP | 2004-055529 | 2/2004 |
| KR | 10-2002-0094905 | 12/2002 |
| KR | 10-2003-0058761 | 7/2003 |
| KR | 1020040014192 A1 | 2/2004 |
| KR | 10-2004-0026007 | 3/2004 |

OTHER PUBLICATIONS

European Search Report, issued Mar. 24, 2006.

* cited by examiner

*Primary Examiner*—Andrew Schechter
*Assistant Examiner*—Charles Chang
(74) *Attorney, Agent, or Firm*—H.C. Park & Associates, PLC

(57) ABSTRACT

A display and a method of manufacturing the same, including a substrate including an image displaying part comprising a plurality of pixels, a dummy testing pad, and a first insulating layer covering the dummy testing pad.

15 Claims, 12 Drawing Sheets

THIN FILM TRANSISTOR ARRAY SUBSTRATE COMPRISING A FIRST INSULATING LAYER COMPLETELY COVERING THE DUMMY TESTING PAD, DISPLAY USING THE SAME, AND FABRICATION METHOD THEREOF

CROSS-REFERENCE TO RELATED APPLICATIONS

This application claims the benefit of Korean Patent Application No. 2004-47887, filed on Jun. 24, 2004, which is hereby incorporated by reference for all purposes as if fully set forth herein.

BACKGROUND

1. Field of the Invention

The present invention relates to a thin film transistor array substrate and a display using the same, and more particularly, to a thin film transistor array substrate having a testing pad for testing electrical characteristics of a thin film transistor, a display using the same, and a method of fabricating the same.

2. Discussion of Related Art

In a display, such as an active matrix light emitting display, a thin film transistor (TFT) is provided in a pixel and used for switch-controlling a pixel electrode. The TFT may be made of a high or a low temperature poly silicon or amorphous silicon and is formed on an insulating substrate, such as a glass substrate or quartz substrate.

A substrate, referred to as a TFT substrate, includes a circuit having the TFT that is provided in an image displaying region and/or a region neighboring the image displaying region.

Electrical characteristics of the TFT are tested before forming the pixel electrode on each pixel of the TFT substrate. The testing process for the TFT substrate is performed using an array tester for testing operations of an adjacent circuit. The array tester is classified as an e-beam type, a capacitor coupling type, or a direct contact type.

For example, in the direct contact type array tester, the corresponding TFT is electrically tested by transmitting an electrical signal to the pad 6 through a testing probe directly contacting a pad 6 and then reading the electric signal again through the testing probe. The pad 6 is formed on one side of the TFT substrate 10 and connected to the TFT (not shown) through a signal line 4, as shown in FIG. 1.

The direct contact type array tester is applicable for a high-resolution display having small-sized pixels.

However, in the direct contact type array tester, since the testing probe directly contacts the pad 6 of the TFT substrate, scratches may be formed on the pad 6. Such scratching may cause defects while the display is fabricated. That is, the scratch formed on the pad 6 due to the direct contact type array tester causes defects, such as pad 6 corrosion, circuit damage, or the like.

SUMMARY OF THE INVENTION

The present invention provides a thin film transistor array substrate including a testing pad for testing electrical characteristics of the thin film transistor, and an electroluminescent display using the same.

Additional features of the invention will be set forth in the description which follows, and in part will be apparent from the description, or may be learned by practice of the invention.

The present invention discloses a display including a substrate having an image displaying part comprising a plurality of pixels, a dummy testing pad, and a first insulating layer covering the dummy testing pad.

The present invention also discloses a thin film transistor array substrate including a thin film transistor array provided on the thin film transistor array substrate, a dummy testing pad, and a first insulating layer covering the dummy pad part, wherein the thin film transistor array comprises a plurality of data lines, a plurality of scan lines, and a thin film transistor coupled with the data lines and the scan lines.

The present invention also discloses a method of forming a display, including forming a plurality of pixels on a substrate, forming a dummy testing pad coupled with at least one of the pixels, performing a test using the dummy testing pad, covering the dummy testing pad with a first insulating layer, and forming a light emitting device coupled with the pixel circuit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Hereinafter, embodiments according to the present invention will be described with reference to the accompanying drawings, wherein the embodiments of the present invention are provided to be readily understood by those skilled in the art.

Figure 1:
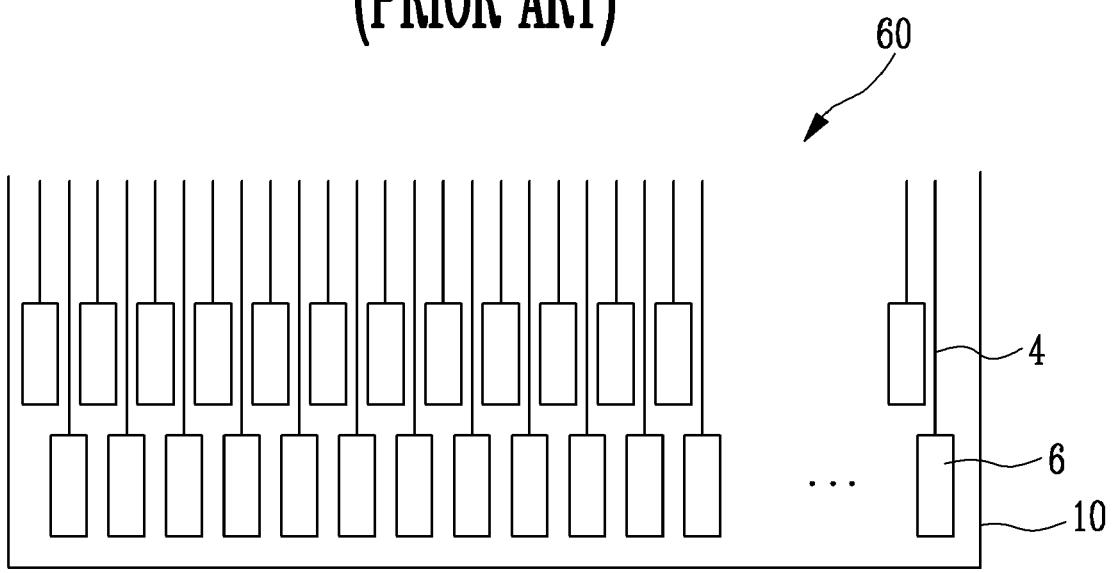
FIG. 1 shows a pad part formed on a conventional thin film transistor array substrate.
Figure 2:
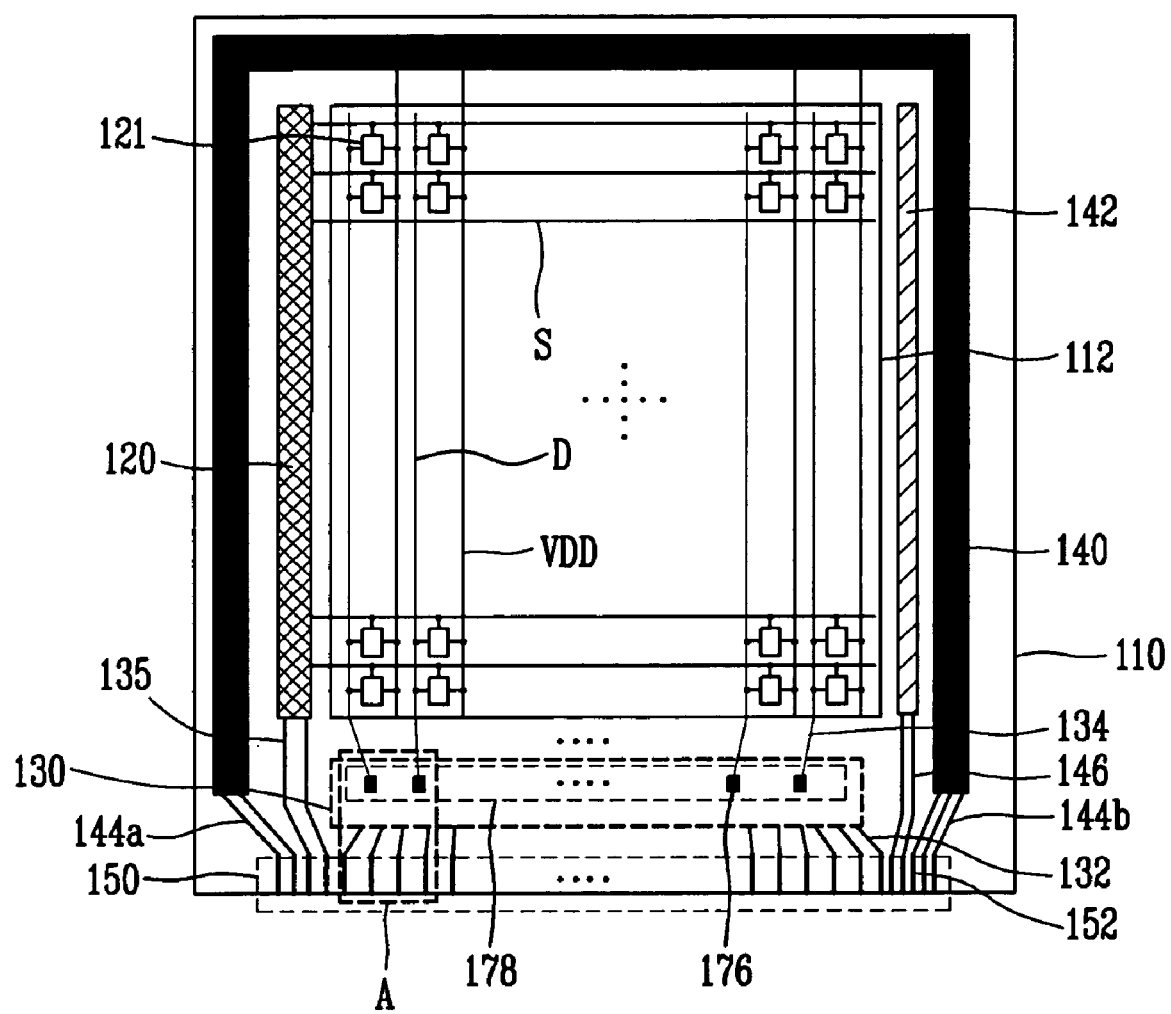
FIG. 2 shows a light emitting display including a thin film transistor array substrate according to an embodiment of the invention.
Figure 3:
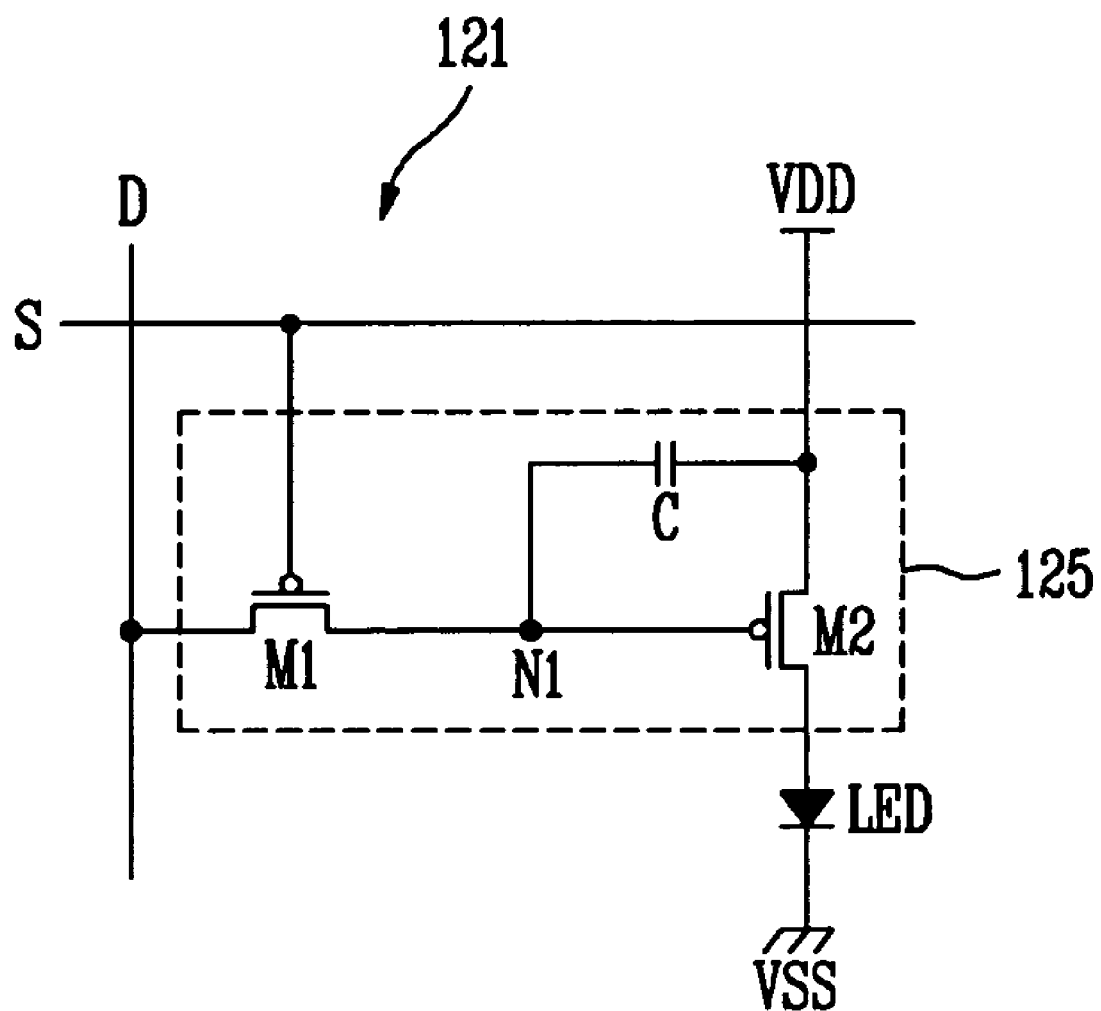
FIG. 3 is a circuit diagram of a pixel associated with the pixel of FIG. 2.

FIG. 2 illustrates a light emitting display including a thin film transistor array substrate according to an embodiment of the invention. FIG. 3 is a circuit diagram of a pixel associated with a pixel of an image display part in FIG. 2.

Referring to FIGS. 2 and 3, a light emitting display having a TFT array substrate includes an image displaying part 112 formed on a substrate 110, a dummy pad part 178, and an insulating layer (not shown). The light emitting display with the TFT array substrate may further include a scan driver 120, a data driver 130, a first power line 140, a second power line 142, and a pad part 150.

The pad part 150 includes at least one TFT, and the image displaying part 112 includes a plurality of pixels 121 defined by a plurality of data lines D, a plurality of scan lines S, and a plurality of pixel power lines VDD.

Each pixel 121 includes a light emitting device LED and a pixel circuit 125. Each pixel 121 is selected according to a scan signal that is applied to the scan line S and emits light according to the data signal that is applied to the data line D.

The light emitting device (LED) includes an anode electrode connected with the pixel circuit 125 and a cathode electrode that is connected with the second power line 142. The light emitting device LED may include an organic light emitting device.

The organic light emitting device (OLED) includes an emitting layer, an electron transport layer, and a hole transport layer, which are provided between an anode electrode and a cathode electrode. The light emitting device may further include an electron injection layer and a hole injection layer. Thus, for example, when a voltage is applied between the anode electrode and the cathode electrode, electrons generated from the cathode electrode travel to the emitting layer via the electron injection layer and the electron transport layer, and holes generated from the anode electrode are moved to the emitting layer via the hole injection layer and the hole transport layer. The electrons from the electron transport layer and the holes from the hole transport layer are then recombined in the emitting layer, thereby emitting light.

The pixel circuit 125 is provided with a first TFT M1, a second TFT M2, and a capacitor C.

The first TFT M1 includes a gate electrode that is connected with the scan line S, a source electrode that is connected with the data line, and a drain electrode that is connected with the first node N1. Thus, for example, the first TFT M1 transmits the data signal to the first node N1 in response to the scan signal transmitted to the scan line S.

The second TFT M2 includes a gate electrode that is connected with the first node N1, which is connected with the drain electrode of the first TFT M1 and the capacitor C, a source electrode that is connected with a pixel power line VDD, and a drain electrode that is connected with the anode electrode of the LED. Thus, for example, the second TFT M2 adjusts current that is applied from the pixel power line VDD to the LED according to the voltage that is applied to the gate electrode of the second TFT M2 that is connected with the first node N1, thereby allowing the LED to emit light.

The capacitor C stores the voltage corresponding to the data signal applied to the first node N1 via the first TFT M1 while the scan signal is transmitted to the scan line S, and the stored voltage holds the second TFT M2 on for one frame when the first TFT M1 is turned off.

According to the embodiment of the invention described above, the display having the TFT array substrate may includes at least two TFTs and at least one capacitor for each pixel circuit 125 of each pixel 121.

The dummy pad part 178 is connected with the plurality of data lines D and a testing pad 176 is only used for testing electrical characteristics of the TFT on the image displaying part 112 in a TFT array testing process.

The pad part 150 is formed with a plurality of pads 152. Each of the plurality of pads 152 may be arranged at a regular interval. The pad part 150 may be coupled with pads of a flexible printed circuit (FPC) (not shown). The pads 152 of the pad part 150, when coupled with the FPC, receive a scan control signal for controlling the scan driver 120, a data control signal for controlling the data driver 130, and the data signal transmitted to the data driver 130 via the FPC. The pads 152 of the pad part 150 receive the first power from the first power line 140 and the second power from the second power line 142 via the FPC.

The first power line 140 has opposite ends connected with at least one of the pads 152 of the pad part 150 through first power connection lines 144*a* and 144*b*. For example, the first power line 140 supplies the first power from the pad part 150 to the pixel power line VDD of each pixel 121 on the image displaying part 112.

The second power line 142 has one end connected with at least one of the pads 152 of the pad part 150 through a second power connection line 146. For example, the second power line 142 may cover or be formed on the surface of the substrate 110 and is coupled with each pixel 121. Further, the second power line 142 may supply the second power from the pad part 150 to each pixel 121 of the image display part 112.

The scan driver 120 generates the scan signal for driving the plurality of scan lines S in sequence in response to the scan control signal input through at least one signal line 135 from among the plurality of pads 152. The scan driver 120 may include a plurality of shift registers to generate the scan signal in sequence according to the scan control signal.

The data driver 130 may be provided between the image displaying part 112 and the pad part 150 of the substrate 110. The data driver 130 transmits the data signal to the plurality of data lines D according to a data control signal that is transmitted from the plurality of pads 152 of the pad part 150. According to an embodiment of the invention, the data driver 130 may be mounted on a chip arrangement part by various methods, such as a chip-on-glass method, a wire-bonding method, a flip chip method, or a beam lead method.

The chip arrangement part may be connected with the data line D through the plurality of first signal lines 134 and may be connected with the pads 152, to which the data signal and the data control signal are transmitted, through a plurality of second signal lines 132.

Figure 4:
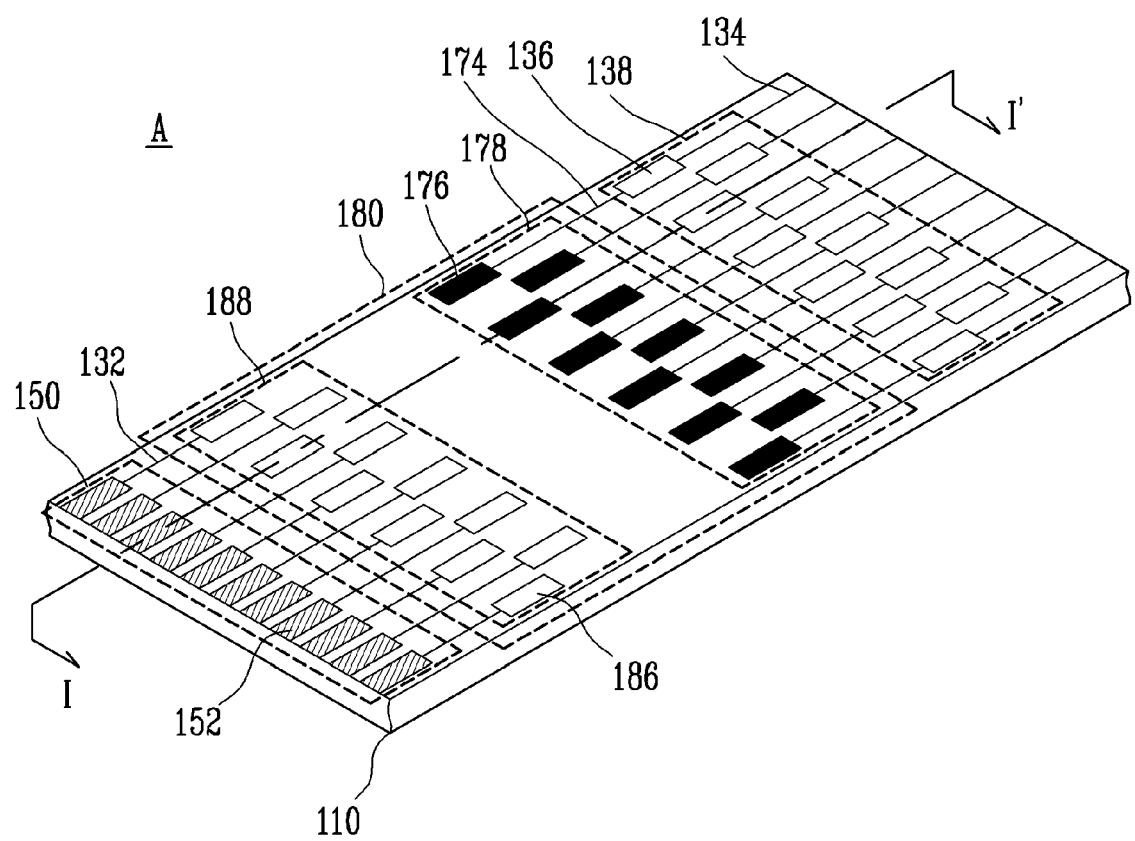
FIG. 4 is a perspective view of a chip arrangement part associated with the chip arrangement part of FIG. 2.

FIG. 4 is a perspective view of a chip arrangement part associated with the chip arrangement part A of FIG. 2.

Referring to FIG. 4, the chip arrangement part 180 includes a first chip terminal 138 having first terminals 136 coupled with first output pins (not shown) of the data driver 130. The chip arrangement part 180 further includes a second chip terminal 188 having second terminals 186 coupled with second input pins (not shown) of the data driver 130. Further, the chip arrangement part 180 is formed with the dummy pad part 178. It is understood that the operation of the first chip terminal 138 having the first terminals 136 may be switched with the operation of the second chip terminal 188 having the second terminals 186.

The first chip terminal 138 includes the first signal lines 134 connected with the data lines D, and the first terminals 136 formed in a predetermined pattern, such as, for example, arranged in a zigzag pattern, at each end of the first signal lines 134. The first chip terminal 138 supplies an output signal, i.e., the data signal of the data driver 130, to the data lines D.

The second chip terminal 188 includes the second signal lines 132 connected with the plurality of pads 152 of the pad part 150, and the second terminals 186 formed in a predetermined pattern, such as, for example, arranged in a zigzag pattern, at each end of the second signal lines 132. The second chip terminal 188 supplies the first input pins with the data control signal and the data signal from the flexible printed circuit via the pad part 150.

Here, the data driver 130 is provided on the first terminals 136 and the second terminals 186 of the chip arrangement part 180 after the TFT array testing process. For example, the data driver 130 may be mounted thereon or integrally formed thereon.

The dummy pad part 178 includes dummy signal lines 174 extending from the first terminals 136 of the first chip terminal 138, and a plurality of testing pads 176 formed in a predetermined pattern, such as, for example, arranged in a zigzag pattern, the end of each dummy signal line 174.

A testing probe contacts the plurality of testing pads 176 during the TFT array testing process; therefore, the dummy pad part 178 is used to receive a testing signal from the testing probe so that the testing probe does not contact another portion of the substrate.

Specifically, for example, during the TFT array testing process for the substrate 110, a TFT array tester (not shown) contacts the pad part 150, thereby transmitting the scan control signal to the scan driver 120. The testing probe contacts the testing pad 176 of the dummy pad part 178 and transmits a testing signal to the testing pad 176 to determine whether the TFTs formed in each pixel 121 of the image displaying part 112 are operating properly.

When the TFT array testing process is finished, an insulating film is formed over the dummy pad part 178 of the substrate 110, preferably covering the dummy pad part 178.

Figure 5:
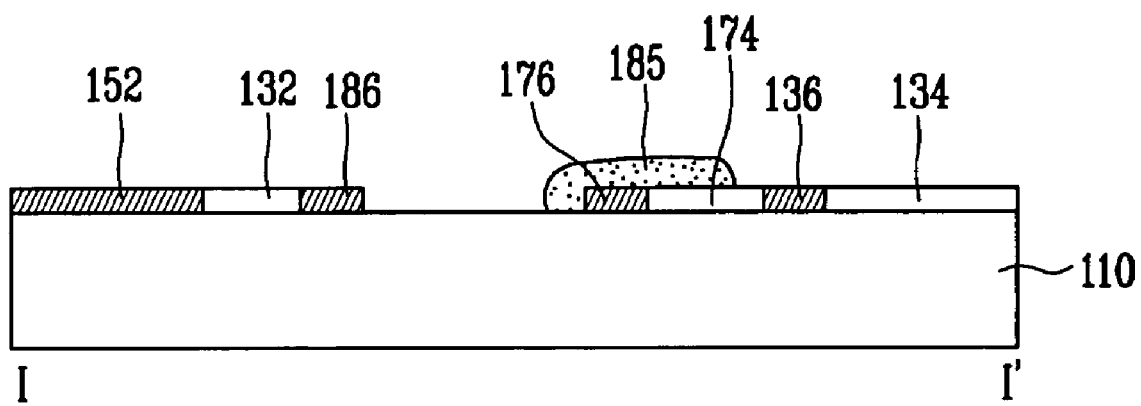
FIG. 5 is a sectional view of the chip arrangement part, taken along line I-I' of FIG. 4.

FIG. 5 is a sectional view of the chip arrangement part, taken along line I-I' of FIG. 4.

Referring to FIG. 5, when the TFT array testing process is finished, a first insulating film 185 is formed over the dummy pad part 178 of the substrate 110, preferably covering the dummy pad part 178. The first insulating film 185 covers the testing pad 176 to prevent the exposure of any scratching of the testing pad 176, thereby preventing defects resulting from the scratching after the TFT array testing process is finished.

Further, at least one insulating film may be formed between the substrate 110 and the testing pad 176. For example, an insulating layer and a passivation layer may be formed on the TFT of the image display part 112 on the substrate 110, and then a source/drain metal layer of the TFT and the testing pad 176 are formed thereon.

According to an embodiment of the invention, during the testing process for the TFT array substrate, the scan control signal may be initially transmitted to the scan driver 120 when the array tester (not shown) contacts the pad part 150 of the substrate 110. The testing signal is transmitted to the testing pad 176 by contacting the testing probe with the testing pad 176 of the dummy pad part 178 to determine whether each TFT formed on the substrate 110 operates properly according to the testing signal.

The first insulating film 185 may be formed over the dummy pad part 178 of the substrate 110 after the electrical characteristics of the TFTs for the pixel 121 and the scan driver 120 are tested. The first insulating film 185 preferably covers the dummy pad part 178.

The above described and shown TFT array substrate may be applied to a flat panel display, such as a liquid crystal display (LCD), a field emission display (FED), a plasma display panel (PDP), an organic light emitting display (OLED), or a light emitting display (LED).

Figure 6:
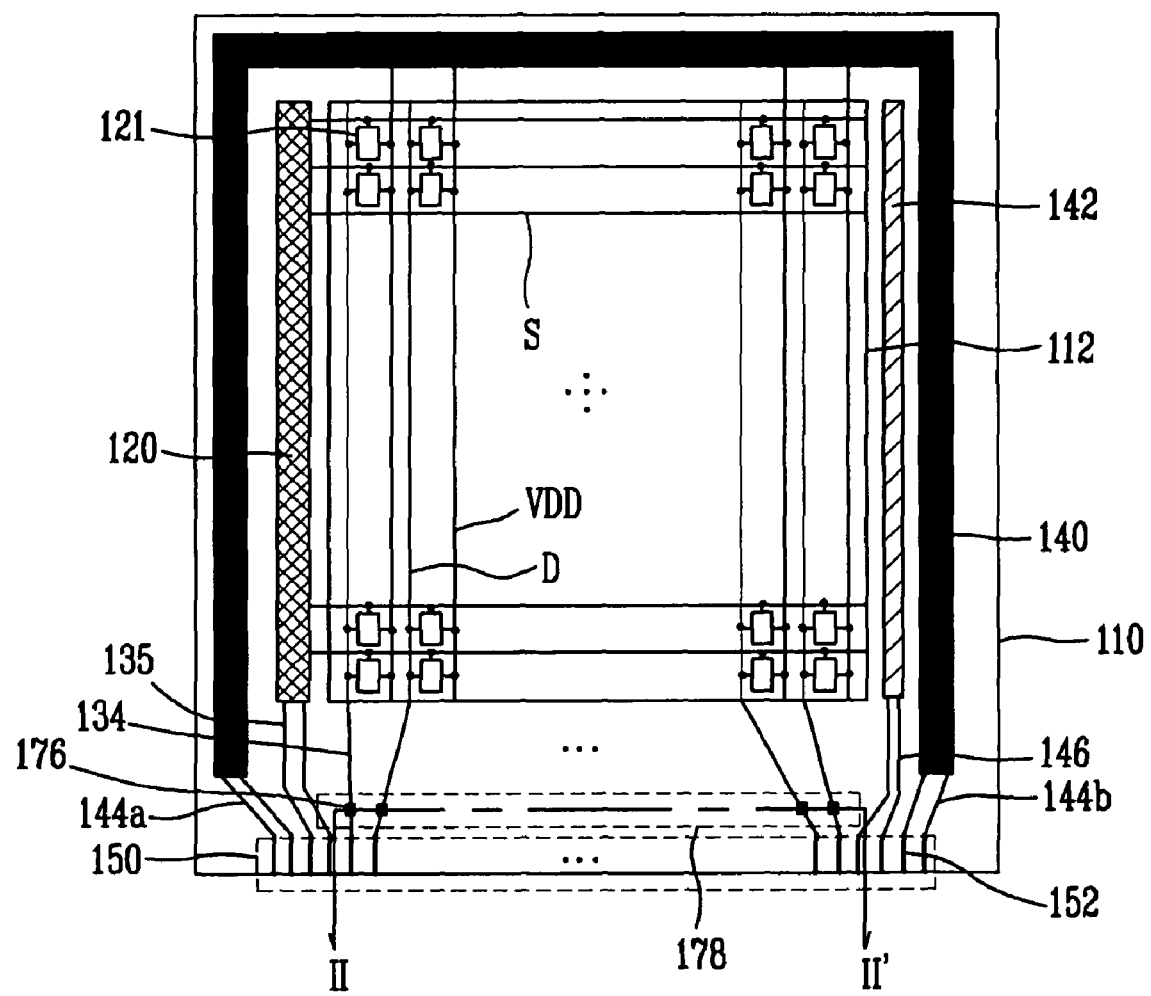
FIG. 6 illustrates a light emitting display comprising a thin film transistor array substrate according to an embodiment of the invention.
Figure 7:
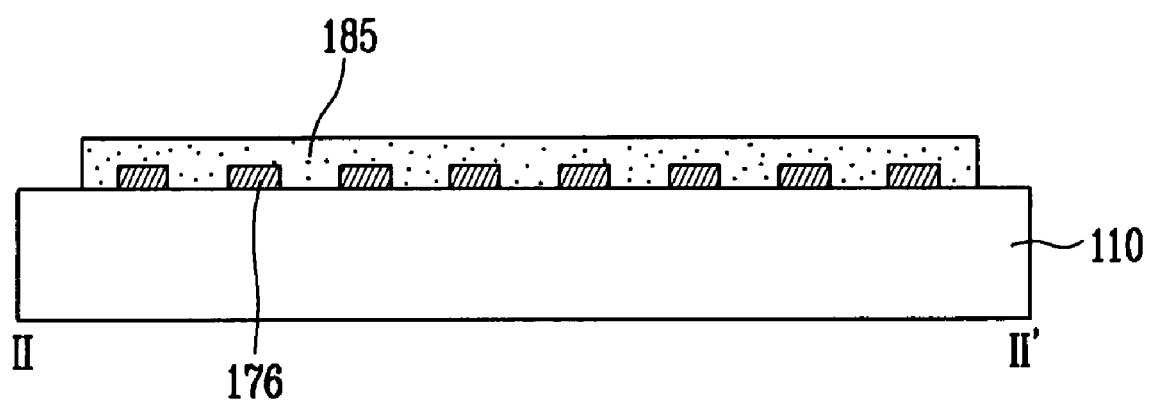
FIG. 7 is a sectional view, taken along line II-II' of FIG. 6.

FIG. 6 shows an organic light emitting display (OLED) including a thin film transistor array substrate according to an embodiment of the invention. FIG. 7 is a sectional view, taken along line II-II' of FIG. 6.

Referring to FIG. 6 and FIG. 7, a display including a TFT array substrate includes an image displaying part 112, a dummy pad part 178, and an insulating layer 185, which are formed on a substrate 110. The display may further include a scan driver 120, a first power line 140, a second power line 142, and a pad part 150.

The display discussed above and shown in FIG. 6 and FIG. 7 has substantially the same configuration as the embodiment discussed above and shown in FIG. 2, FIG. 3, except for a dummy pad part 178 and a data driver (not shown); therefore, repetitive descriptions will be avoided, as necessary.

According to an embodiment of the invention, the display including the TFT array substrate further includes a data driver, which is provided outside of the substrate 110, that transmits a data signal to the pad part 150 through a flexible printed circuit (FPC) (not shown).

The image displaying part 112 includes a plurality of data lines D coupled with the plurality of pads 152. The data signal is transmitted from the data driver, from among the plurality of pads 152, via a plurality of signal lines 134.

The dummy pad part 178 includes testing pads 176 formed or provided on each of the signal lines 134.

A testing probe contacts the testing pad 176 during the TFT array testing process. The testing pad 176, which receives a testing signal from the testing probe, is only used during the TFT array testing process.

Specifically, for example, during the TFT array testing process for the display comprising the TFT array substrate, an array tester (not shown) contacts the pad part 150 of the substrate 110 and transmits a scan control signal to the scan driver 120. The testing probe then contacts the testing pad 176 and transmits a testing signal to the testing pad 176 to determine whether the TFTs formed in each pixel 121 of the image display part 112 operates properly.

Referring to FIG. 7, when the TFT array testing process is finished, a first insulating film 185 is formed over the dummy pad part 178 of the substrate 110, preferably covering the dummy pad part 178. The first insulating film 185 covers the testing pad 176 to prevent the exposure of any scratching of the testing pad 176 caused by contact of the testing probe, thereby preventing defects resulting from the scratching after the TFT array testing process is finished.

Figure 8:
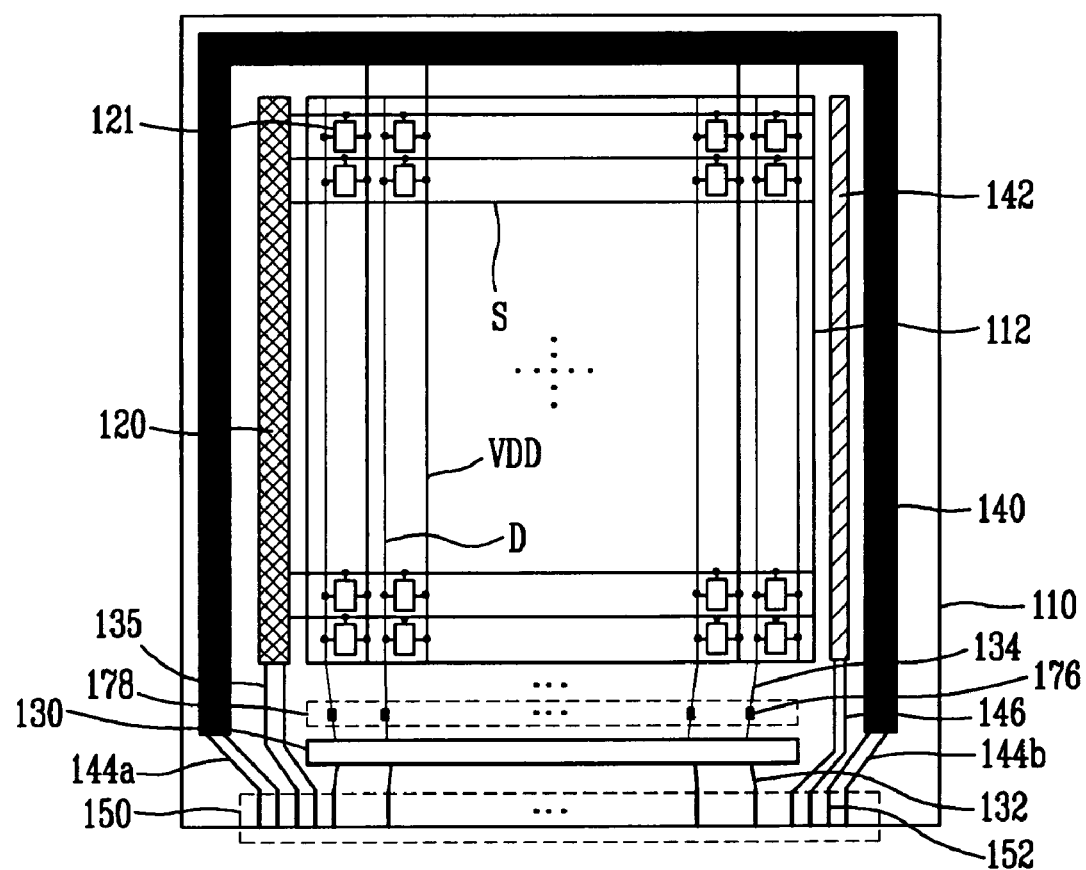
FIG. 8 illustrates a light emitting display including a thin film transistor array substrate according to an embodiment of the invention.

FIG. 8 illustrates an organic light emitting display having a thin film transistor array substrate according to an embodiment of the invention.

Referring to FIG. 8, a display having a TFT array substrate has substantially the same configuration as the embodiment of the invention discussed above and shown in FIGS. 2, 3, 4, and 5, except for a data driver 130; therefore, repetitive descriptions will be avoided as necessary.

According to an embodiment of the invention, the display having the TFT array substrate includes a data driver 130 that is provided on the substrate 110 and coupled with and provided between a dummy pad part 178 and a pad part 150. The data driver 130 is preferably directly mounted or attached to the substrate 110. For example, the data driver 130 may be directly mounted on the substrate 110 so that a data signal transmitted through the pad part 150 is supplied to a data line D of an image displaying part 112.

FIGS. 9A, 9B, 9C, and 9D are sectional views for illustrating a method of fabricating the TFT array substrate and the display using the same according to the embodiments of the invention described above and shown in FIG. 2, FIG. 3, FIG. 4, FIG. 5, FIG. 6, FIG. 7, and FIG. 8. Specifically, FIGS. 9A, 9B, 9C, and 9D illustrating a method of fabricating one TFT included in the pixel circuit 125 and the testing pad 176 of the dummy pad part 178 as shown in FIG. 2, FIG. 6, and FIG. 8.

Figure 9A:
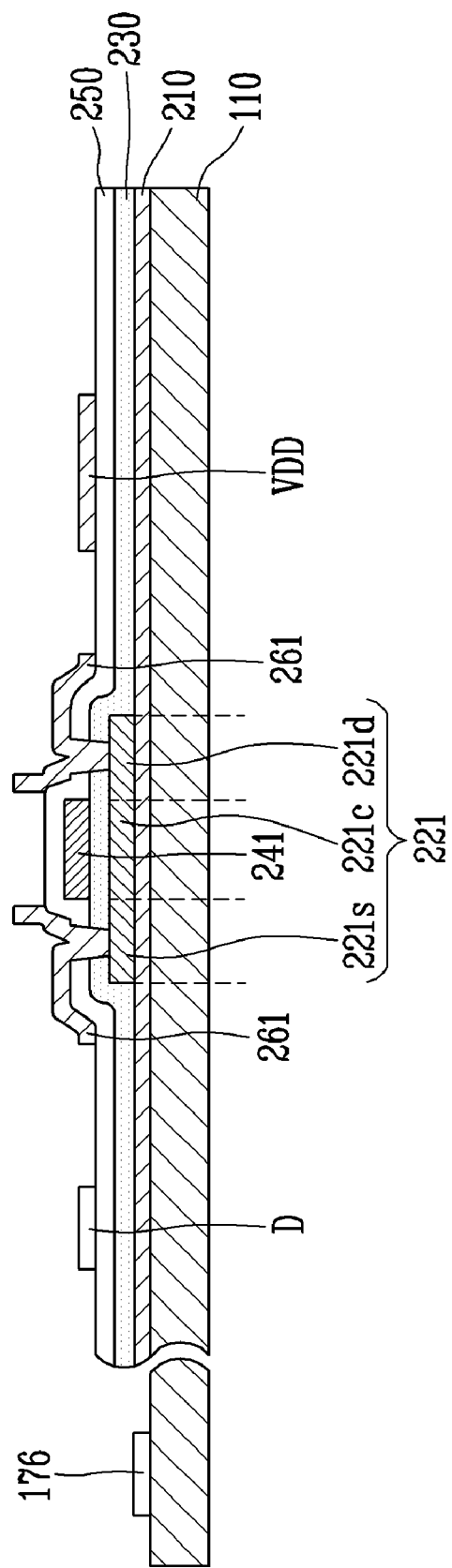
FIGS. 9A, 9B, 9C, and 9D are sectional views illustrating a method of fabricating a thin film transistor and a testing pad of each pixel shown in FIGS. 2, 6 and 8.

Referring to FIG. 9A, a buffer layer 210 is formed as a first insulating layer on a substrate 110. The buffer layer 210 may formed as a single layer, including, for example, a layer of silicon oxide ($SiO_2$) or silicon nitride ($SiN_x$). Alternatively, the buffer layer 210 may be formed as a multiple layer, including, for example, a layer of silicon oxide ($SiO_2$) and a layer of silicon nitride ($SiN_x$).

Amorphous silicon is subsequently deposited on the buffer layer 210 and crystallized into an active layer 221. A gate-insulating layer 230 is subsequently formed as a second insulating layer on the active layer 221. The gate insulating layer 230 may be formed as a single layer, including, for example, a layer of silicon oxide ($SiO_2$) or silicon nitride ($SiN_x$). Alternatively, the gate insulating layer 230 may be formed as a multiple layer, including, for example, a layer of silicon oxide ($SiO_2$) and a layer of silicon nitride ($SiN_x$).

A gate electrode 241 is subsequently formed on the active layer 221. For example, the gate electrode 241 may overlap the active layer 221 by a predetermined area. Further, the gate electrode 241 may be formed when a scan line is formed on the substrate 110.

The substrate 110 is subsequently doped with an ion, thereby doping a source region 221s and a drain region 221d of the active layer 221 with the ion. As such, the active layer 221 is formed with a channel 221c provided between the source region 221s and the drain region 221d.

An interlaying insulator 250 is subsequently formed as a third insulating layer on the gate electrode 241. The interlaying insulator 250 can be formed having a single layer or multiple layers.

After forming a contact hole on the interlaying insulator 250, a source/drain electrode 261 is formed to connect, e.g., couple, the source region 221s and the drain region 221d of the active layer 221 through the contact hole. A pixel power line VDD, a pad part 150, and a testing pad 176 of a dummy pad part 178 may be simultaneously formed thereon. At least one insulating layer may be formed between the substrate 110 and the testing pad 176. For example, the buffer layer 210, the gate insulating layer 230, and the interlaying insulator 250 may be simultaneously formed on the TFT of an image display part 112 of the substrate 110, and the source region 221s and the drain region 221d of the TFT and the testing pad 176 may be simultaneously formed thereon.

Figure 9B:
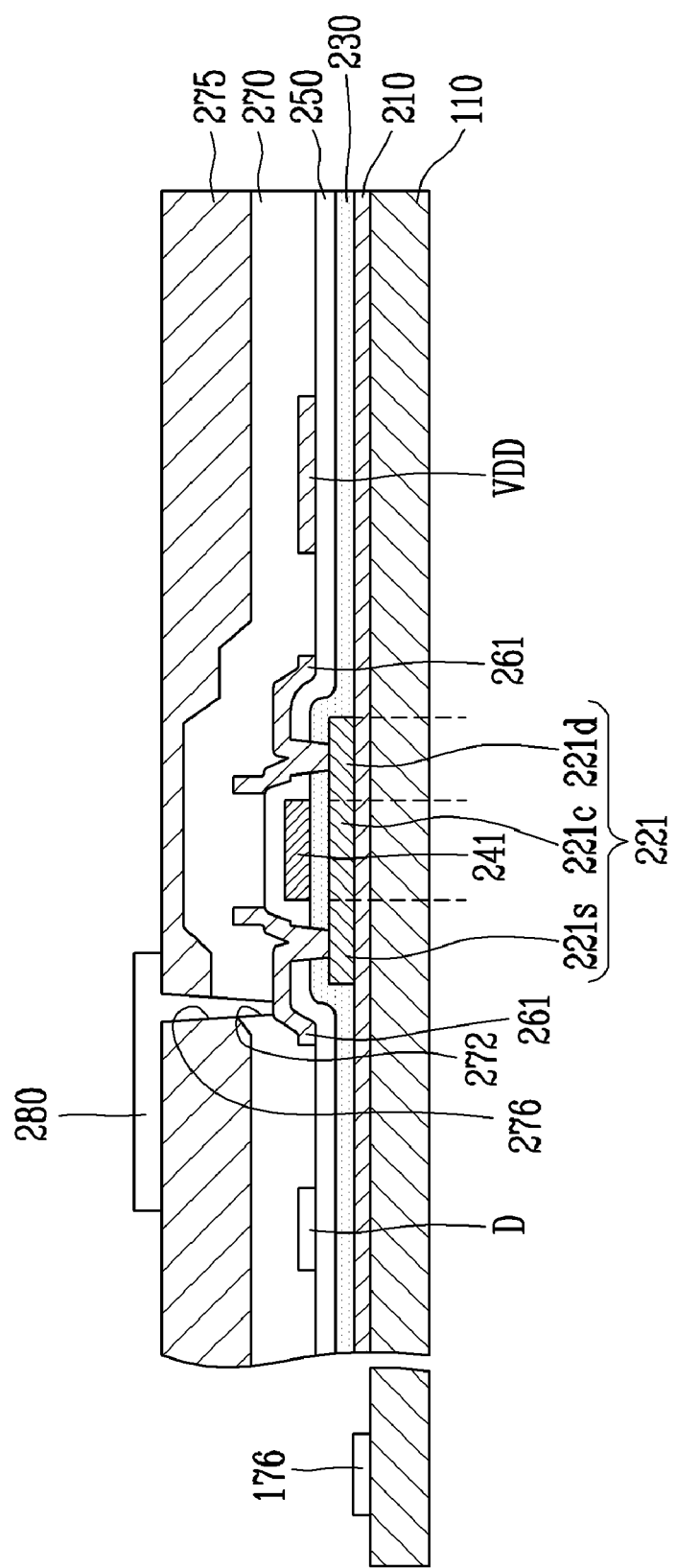

According to an embodiment of the invention shown in FIG. 9B, a passivation layer 270 may be formed as a fourth insulating layer on the source/drain electrode 261. A planarization layer 275 may be subsequently formed on the passivation layer 270. The passivation layer 270 may be made of silicon oxide ($SiO_2$), silicon nitride ($SiN_x$), etc. The planarization layer 275 may be made of an organic material, such as acryl, poly-imide, or BCB.

Contact holes 272 and 276 may subsequently be formed by photolithography or a boring operation on the passivation layer 270 and the planarization layer 275. A first electrode 280 may subsequently be formed on the planarization layer 275 and coupled with the source/drain electrode 261.

According to the above described embodiment of the invention, the pixel circuit of each pixel and the signal lines, such as the scan line, the data line and the pixel power line, may be formed by the fabrication method shown in FIG. 9A and FIG. 9B.

Electrical properties of the TFT are tested using the testing pad 176 that is formed according to the fabrication methods shown in FIGS. 9A and 9B.

Figure 9C:
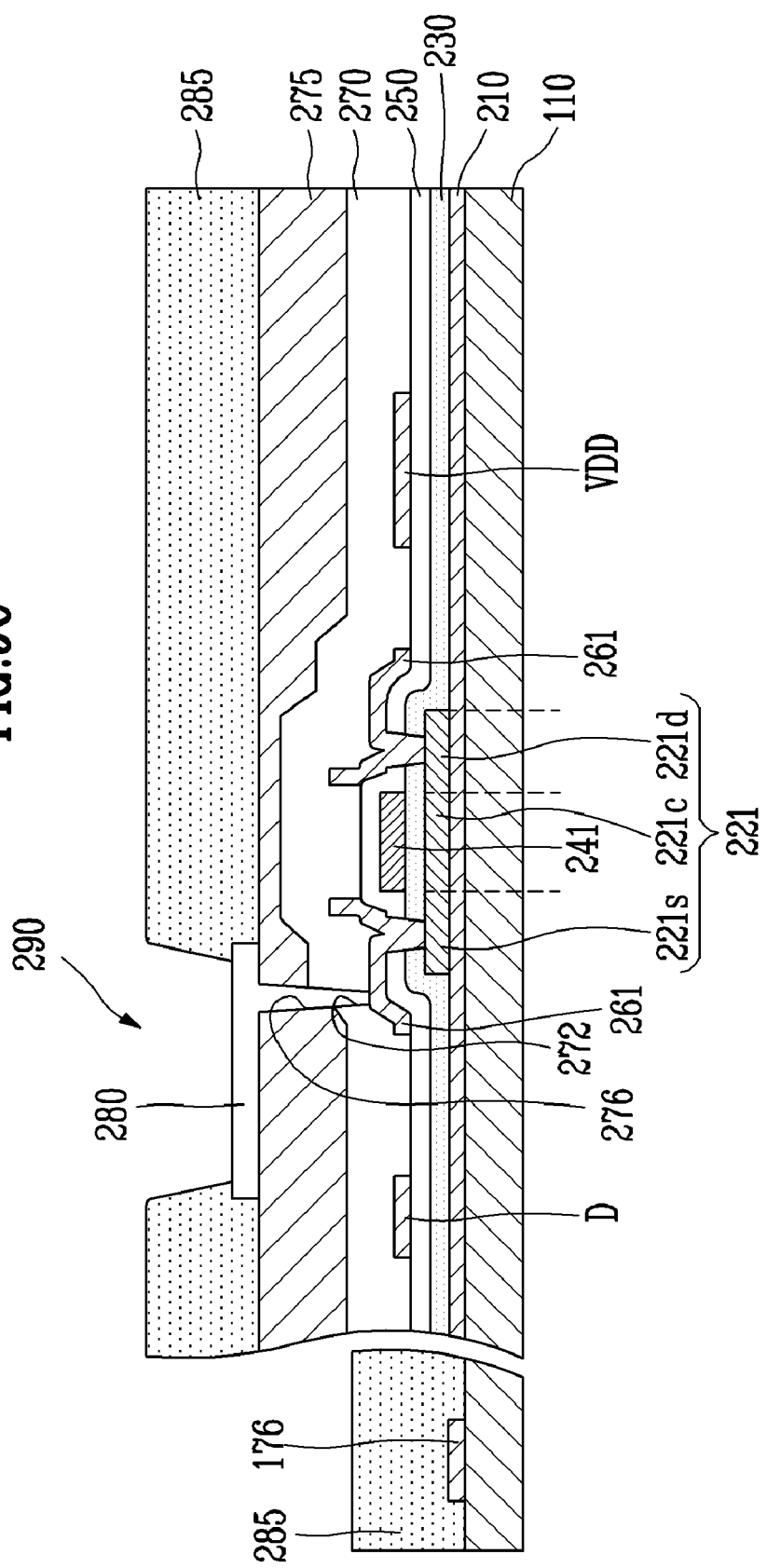

According to an embodiment of the invention, after testing the electrical properties of the TFT, a pixel definition layer 285 may be formed as an insulating layer on the planarization layer 275. The pixel definition layer 285 is excluded from a pixel region 290 having the first electrode 280, as shown in FIG. 9C.

The first electrode 280, which is exposed by the pixel definition layer 285, is defined as the pixel region 290. The pixel definition layer 285 is formed over the testing pad 176 of the dummy pad part 178, preferably covering the testing pad 176. For example, the dummy pad part 178 may be covered with a nonconductive material having a thickness and permittivity sufficient to prevent an electrical signal from being transmitted therethrough, by the same process as the fabrication process for the pixel definition layer 285. The pixel definition layer 285 may include an organic material or a nonconductive material used for the passivation layer and the insulating layer.

A display device is subsequently formed on the pixel region 290, wherein the displaying device displays an image according to switching of the TFT of each pixel 121. For example, a liquid crystal layer of a liquid crystal display, a LED of a light emitting display, or the like, may be formed on the pixel region 290.

According to an embodiment of the invention, the LED of the light emitting display is formed on the pixel region 290 as follows.

Figure 9D:
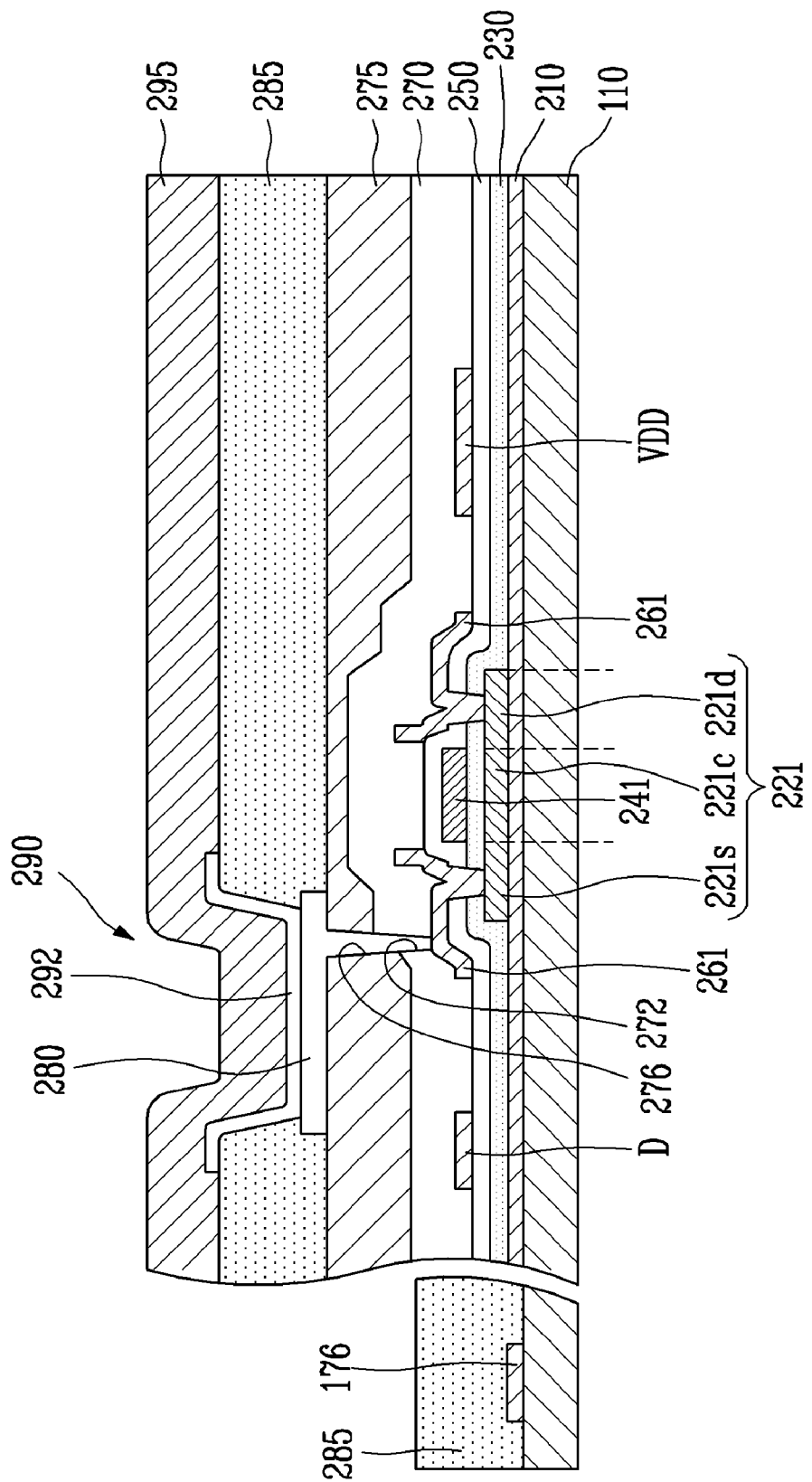

Referring to FIG. 9D, a LED 292 may be formed on the first electrode 280 and on an opening including sides of the pixel definition layer 285 of the pixel region 290. A second electrode 295 may be subsequently formed over the LED 292, preferably covering the LED 292.

The LED 292 has an anode electrode coupled with the first electrode 280 and a cathode electrode coupled with the second electrode 295. The light emitting display may include an organic light emitting device (OLED). The OLED includes an emitting layer, an electron transport layer, and a hole transport layer, which are provided between an anode electrode and a cathode electrode. The light emitting display may further include an electron injection layer and a hole-injection layer. Thus, when a voltage is applied between the anode electrode and the cathode electrode, electrons generated from the cathode electrode travel to the emitting layer via the electron injection layer and the electron transport layer, and holes generated from the anode electrode travel to the emitting layer via the hole injection layer and the hole transport layer. The electrons from the electron transport layer and the holes from the hole-transport layer recombine in the emitting layer, thereby emitting light.

According to an embodiment of the invention, the method of fabricating the TFT array substrate and the display having the same includes forming TFTs and signal lines on the substrate 110, and then testing whether the TFTs operate properly. After testing the electrical characteristics of the TFTs, the dummy pad part 178 is covered with the second insulating layer 285, thereby preventing defects from occurring due to scratching during the testing process.

According to the embodiments of the invention described above, the present invention provides a TFT array substrate, a display comprising the same, and a fabrication method thereof, in which testing pads having a scratch due to contact of a testing probe at an array testing process are covered with an insulating layer, thereby preventing defects, such as corrosion of the testing pad and damage of the pixel circuit, at a subsequent fabricating process.

Further, the present invention provides a TFT array substrate, a display including the same, and a fabrication method thereof, in which an insulating layer for covering the testing pad is made of the same material as the insulating layer formed between pixels, thereby simplifying a structure and the fabrication process and reducing fabrication cost.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display, comprising:
   a substrate, comprising:
   an image displaying part comprising a plurality of pixels;
   a dummy testing pad connected to a single signal line through a chip terminal, the chip terminal being connected to a first pixel through the signal line to provide a signal to drive the first pixel;
   a first insulating layer completely covering the dummy testing pad;
   a data driver to transmit a data signal to a data line of the image displaying part; and
   a pad formed on the substrate and coupled with the data driver,
   wherein the dummy testing pad comprises:
   a dummy signal line coupled with the data line and the data driver; and
   a testing pad connected to the dummy signal line.

2. The display of claim 1, wherein each pixel comprises:
   a light emitting device; and
   a pixel circuit, coupled with the light emitting device and the data line of the image displaying part, comprising:
   a thin film transistor;
   a pixel electrode electrically connected to a source or a drain of the thin film transistor; and
   a pixel definition insulating layer to define a pixel region on the pixel electrode.

3. The display of claim 2, wherein the first insulating layer is formed of the pixel definition insulating layer.

4. The display of claim 1, further comprising:
   a plurality of pads formed on the substrate and respectively coupled with a plurality of data lines of the image displaying part through a plurality of corresponding signal lines.

5. The display of claim 1, further comprising:
   a scan driver to transmit a scan signal to a scan line of the image displaying part; and
   the pad coupled with the scan driver.

6. The display of claim 1, further comprising:
   a power line to provide a voltage to the image displaying part; and
   the pad coupled with the power line.

7. A thin film transistor (TFT) array substrate, comprising:
   a thin film transistor array provided on the thin film transistor array substrate, the thin film transistor array comprising a plurality of data lines, a plurality of scan lines, and a thin film transistor;
   a dummy testing pad connected to a single signal line through a chip terminal, the chip terminal being connected to the thin film transistor through the signal line to provide a signal to drive the thin film transistor, the signal line being a data line or a scan line;
   a first insulating layer completely covering the dummy testing pad;
   a data driver to transmit a data signal to the data line of the thin film transistor array; and
   a pad formed on the thin film transistor array substrate and coupled with the data driver;
   wherein the dummy testing pad comprises:
   a dummy signal line coupled with the data line and the data driver; and
   a testing pad connected to the dummy signal line.

8. The TFT array substrate of claim 7, further comprising:
   a plurality of pixels defined by the plurality of data lines and scan lines, each pixel comprising:
   a thin film transistor;
   a pixel electrode electrically connected to a source or a drain of the thin film transistor; and
   a pixel definition insulating layer to define a pixel region on the pixel electrode.

9. The TFT array substrate of claim 8, wherein the first insulating layer is formed of the pixel definition insulating layer.

10. The TFT array substrate of claim 7, further comprising:
    a plurality of first pads formed on the substrate and respectively coupled with the data lines via corresponding signal lines.

11. The TFT array substrate of claim 10, wherein the testing pad is provided on each signal line.

12. A method of forming a display, comprising:
    forming a plurality of pixels on a substrate;
    forming a dummy testing pad connected to a single signal line through a chip terminal, the chip terminal being connected to a first pixel through the signal line;
    performing a test using the dummy testing pad;
    covering completely the dummy testing pad with a first insulating layer;
    forming a light emitting device coupled with a pixel circuit of the first pixel;
    forming a data driver to transmit a data signal to a data line of the plurality of pixels; and
    forming a pad formed on the substrate to couple with the data driver;
    wherein forming the dummy testing pad comprises:
    forming a dummy signal line coupled with the data line and the data driver; and
    forming a testing pad connected to the dummy signal line.

13. The method of claim 12, further comprising:
    forming a pixel electrode for each pixel; and
    forming a pixel definition insulating layer to define a pixel region on the pixel electrode.

14. The method of claim 13, wherein the first insulating layer is formed of the pixel definition insulating layer.

15. The method of claim 12, wherein the forming the dummy testing pad further comprises:
    forming a plurality of signal lines coupled with a plurality of corresponding data lines; and
    forming the dummy testing pad on each signal line.

* * * * *